(12) United States Patent
Luo et al.

(10) Patent No.: US 6,950,046 B2
(45) Date of Patent: Sep. 27, 2005

(54) IC WITH BUILT-IN SELF-TEST AND DESIGN METHOD THEREOF

(75) Inventors: Pei-Wen Luo, Kaohsiung (TW); Yeong-Jar Chang, Taichung (TW); Jung-Chi Ho, Taipei (TW); Wen-Ching Wu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/894,054

(22) Filed: Jul. 20, 2004

(65) Prior Publication Data

US 2005/0174273 A1 Aug. 11, 2005

(30) Foreign Application Priority Data

Feb. 11, 2004 (TW) .............................. 93103150 A

(51) Int. Cl.[7] .............................................. H03M 1/10
(52) U.S. Cl. ...................... 341/120; 341/118; 341/155; 714/733; 714/734
(58) Field of Search ..................... 341/118, 120, 143, 341/155; 714/733–734

(56) References Cited

U.S. PATENT DOCUMENTS

| | | | | |
|---|---|---|---|---|
| 4,539,683 A | * | 9/1985 | Hahn et al. ................. 341/120 |
| 5,068,657 A | * | 11/1991 | Tsai ............................ 341/120 |
| 5,132,685 A | * | 7/1992 | DeWitt et al. ............... 341/120 |
| 5,659,312 A | * | 8/1997 | Sunter et al. ................ 341/120 |
| 5,790,562 A | * | 8/1998 | Murray et al. .............. 714/732 |
| 5,909,186 A | * | 6/1999 | Gohringer ................... 341/120 |
| 5,969,653 A | * | 10/1999 | Sachdev ...................... 341/120 |
| 6,184,810 B1 | * | 2/2001 | Burns ......................... 341/143 |
| 6,211,803 B1 | * | 4/2001 | Sunter ........................ 341/120 |
| 6,229,465 B1 | * | 5/2001 | Bulaga et al. .............. 341/120 |
| 6,259,389 B1 | * | 7/2001 | McGrath .................... 341/120 |
| 6,557,131 B1 | * | 4/2003 | Arabi ......................... 714/734 |
| 6,675,322 B1 | * | 1/2004 | Schaffroth et al. ........... 714/25 |
| 6,691,077 B1 | * | 2/2004 | Burns et al. .................. 703/4 |
| 2002/0019962 A1 | * | 2/2002 | Roberts et al. ............. 714/724 |

OTHER PUBLICATIONS

Luo et al., "Testable Sigma-Delta ADC Design without Performance Degradation," VLSI Design CAD Symposium, Aug. 12, 2003.

\* cited by examiner

*Primary Examiner*—Michael Tokar
*Assistant Examiner*—Khai Nguyen
(74) *Attorney, Agent, or Firm*—Birch, Stewart, Kolasch & Birch, LLP

(57) ABSTRACT

IC with built-in self-test and design method thereof. The IC comprises an SD-ADC and a Dft circuit. The Dft circuit uses a digital stimulus signal to solve the deadlock problem of the on-chip analog testing and avoid thermal noise. Moreover, according to the design method of the IC, circuits having different specification can use the Dft circuit without performance degradation for original SD-ADC.

17 Claims, 14 Drawing Sheets

IC WITH BUILT-IN SELF-TEST AND DESIGN METHOD THEREOF

This Nonprovisional application claims priority under 35 U.S.C. § 119(a) on Patent Application No(s). 093103150 filed in the Republic of China on Feb. 11, 2004, the entire contents of which are hereby incorporated by reference.

BACKGROUND

The invention relates to an IC with built-in self-test and a design method thereof, and in particular to an IC with built-in self-test and a design method thereof employed in a sigma-delta analog-to-digital converter (SD-ADC), degrading difficulty in designing the circuit and preventing performance degradation of the circuit caused by thermal noise.

Analog/mixed-signal testing requires a signal source generator and an analog response analyzer, which can be realized by many analog instruments/meters or by a mixed-signal automatic testing equipment externally. The testing always suffers from the I/O signal degradation or the noise effects on the analog stimulus and measurement. Any attempt to realize an on-chip analog/mixed-signal testing requires characterization and quantification of the signal source generator and the analog response analyzer first, which could be prohibitively expensive. The cost to test the analog portion of a mixed-signal device can be as high as 50% of the total cost.

Over sampling analog-to-digital and digital-to analog converters (ADC and DAC) have become popular for high-resolution medium-to-low-speed applications. The use of shaped quantization noise applied to over sampling signals is commonly referred to as a sigma-delta ($\Sigma\Delta$) modulation. The main advantage of the sigma-delta modulation is its higher resolution, but testing thereof requires better resolution than itself. This modulation can provide a deadlock problem in the on-chip analog testing.

A digital stimulus measurement technique (DSMT) has been suggested in the related art. See C. K. Ong, K. T. Chen, and L. C. Wang, "Self-testing Second-Order Delta-Sigma Modulator Using Digital Stimulus" In Proc. VLSI Test Symposium, pp. 237–46, April 2002 (hereafter referred to as "related art"). According to the prior art, the test stimulus is a digital bit-stream transformed from a sinusoid wave by a software modulator as shown in FIG. 1. FIG. 2 is a system block diagram of the delta-sigma modulator in FIG. 1. In testing mode, an analog input signal X2 is disconnected from the modulator (SD-ADC) 20 and the bit-stream Si2 amplitude is reduced to maintain stability of the modulator 20. The amplitude reduction is accomplished by a gain module 22 of a design-for-test (Dft) circuit 21 of which the gain is ¼. In the related art, reference voltages are selected by the bit-stream Si2. The selected reference voltage is reduced by the gain module 22 and is then used to test the modulator 20.

Since the modulator 20 is a switch-capacitor (SC) type, the Dft circuit 21 requires a small capacitor. The capacitor can cause thermal noise, reducing performance degradation of the modulator 20. The analysis of thermal noise is described below.

It is assumed that the maximum value of the capacitor is 10 p, the max peak-to-peak signal is 1, and the over sampling rate is 400. When the Dft circuit 21 is not applied in the modulator 20, the analysis of thermal noise is represented by the following formula:

$$NoisePower = \frac{KT}{C} = \frac{1.38 \times 10^{-23} \times 300}{2 \times 10^{-12}} = 2.07 \text{ nV}$$

$$SNR = 10\log\left(\frac{SignalPower}{2.07 \text{ n}}\right) + 10\log(OSR) \approx 103.7 \text{ dB} = 17.3 \text{ bit}$$

When the Dft circuit 21 is applied in the modulator 20 and the minimum capacitance of the capacitor is 0.75 p, the analysis of thermal noise is represented by the following formula:

$$NoisePower = 74.3 \text{ nV}$$

$$SNR = 10\log\left(\frac{SignalPower}{74.3 \text{ n}}\right) + 10\log(OSR) \approx 99.4 \text{ dB} = 16.5 \text{ bit}$$

wherein, SNR represents signal-to-noise ratio, k Boltzmann constant, T absolute temperature, and ORS over sampling rate.

According to the above analysis, the Dft circuit 21 with the capacitor causes resolution degradation of the modulator 20.

When designing an analog integrated circuit, the circuit size and cost are limited, causing performance of internal components therein to be insufficient, thus capacitors are limited to a maximum value. Therefore, when maximum capacitance does not change, the Dft circuit 21 causes resolution degradation, that is, performance degradation. Moreover, the technique of the related art is limited to application in one specific circuit, thus, the technique suggested by the related art is not capable of utilizing various circuits correctly.

SUMMARY

Accordingly, embodiments of the invention provide an IC with built-in self-test that ameliorates disadvantages of the related art.

Accordingly, an embodiment of the invention provides an IC with built-in self-test, and the IC comprises a sigma-delta analog-to-digital converter (SD-ADC) and a test circuit.

The SD-ADC has a first and a second input terminals, receives a first and a second reference voltage signals, and comprises a first-stage translation unit with a first-stage gain and a second-stage translation unit with a second-stage gain. The test circuit tests the SD-ADC and receives a first stimulus, and a gain of the test circuit is set to 1.

In a testing mode, the test circuit respectively provides a third reference voltage signal and a fourth reference voltage signal to the first and the second input terminals according to the first stimulus and the SD-ADC outputs a first digital signal. The third and fourth reference voltage signals are inverse to each other. In an operating mode, the test circuit respectively provides a first and a second analog signals to the first and the second input terminals according to the first stimulus and the SD-ADC outputs a second digital signal.

A detailed description is given in the following embodiments with reference to the accompanying drawings.

BRIEF DESCRIPTION OF THE DRAWINGS

Various aspects of embodiments of the invention can be more fully understood by reading the subsequent detailed description and examples with references made to the accompanying drawings, wherein:

FIG. 3b shows circuit of the conventional second-order SD-ADC in FIG. 3a.

DETAILED DESCRIPTION

Figure 3A:
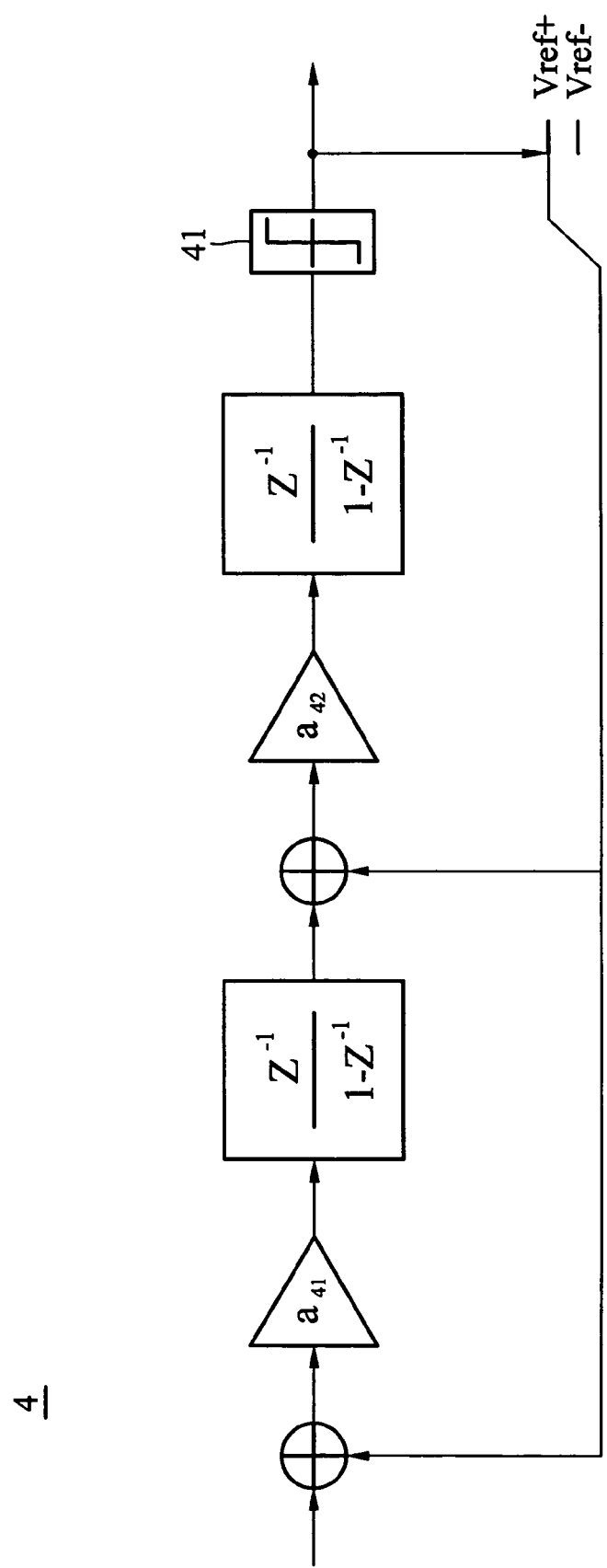
FIG. 3a is a block diagram of a conventional second-order SD-ADC.
Figure 3B:
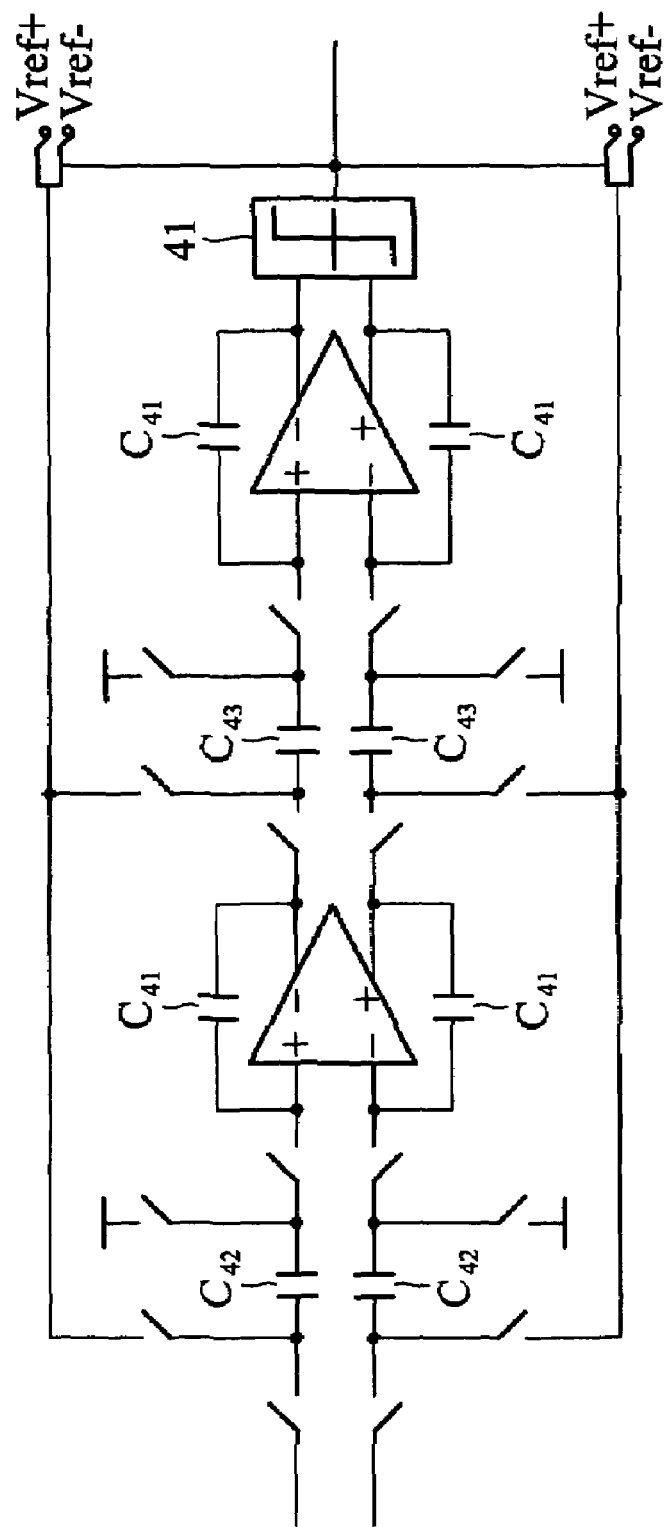

FIG. 3a is a block diagram of a conventional second-order sigma-delta analog-to-digital converter (SD-ADC). A feedback loop gain of a second-order SD-ADC 4 is set to be 1 to reduce the design complexity and the corresponding circuit is presented in FIG. 3b. A integrator 41 comprises a amplifier, two sampling capacitors and two integrating capacitors. The ratio of a capacitor $C_{42}$ to a capacitor $C_{41}$ and the ratio of a capacitor $C_{43}$ to a capacitor $C_{41}$ are chosen so as to realize a first-stage gain $a_{41}$ and a second-stage gain $a_{42}$ respectively. An embodiment of the invention provides a Dft circuit applied in the SD-ADC 4 of FIG. 3a.

As above the described, when the capacitance becomes large, the resolution becomes high. If the capacitance is too large, however, circuit layout is difficult due to the size limitation. In order to achieve high OSR, the SD-ADC 4 is designed to have an appropriate capacitance to avoid the limitation related to thrust of switches and amplifiers within the circuit. In this embodiment of the invention, a signal frequency is set to be 22 k, a maximum capacitance 10 p, and OSR 400, so that, SNR is equal to 17.3 bit.

Figure 4:
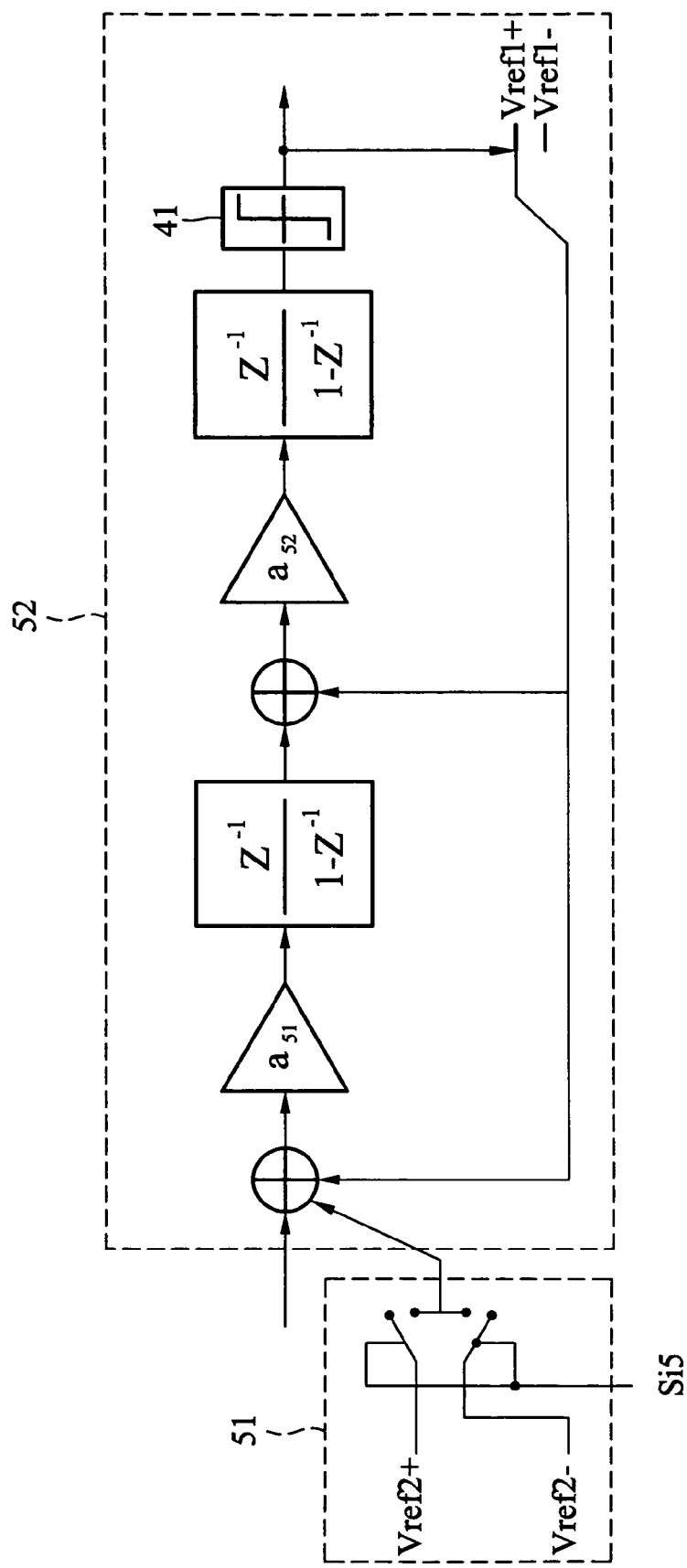
FIG. 4 is a systemic block diagram of an IC with built-in self-test according to an embodiment of the invention.

FIG. 4 is a systemic block diagram of an IC with built-in self-test according to an embodiment of the invention. The IC comprises a Dft circuit 51 and a second-order SD-ADC 52. The SD-ADC 52 receives reference voltage signals Vref1+ and Vref1− inverse to each other. In order to avoid performance degradation, a gain of the Dft circuit 51 is set to be 1. Referring to FIG. 4, in testing mode, the Dft circuit 51 receives a digital stimulus Si5 to select reference voltage signals Vref2+ and Vref2− and directly outputs them to the SD-ADC 52. At the same time, quantization noise caused by the digital stimulus Si5 is input to the SD-ADC 52. The quantization noise is estimated by software simulation and then the measured SNR can be recovered. Therefore, the performance of the SD-ADC 52 is measured correctly.

Figure 5:
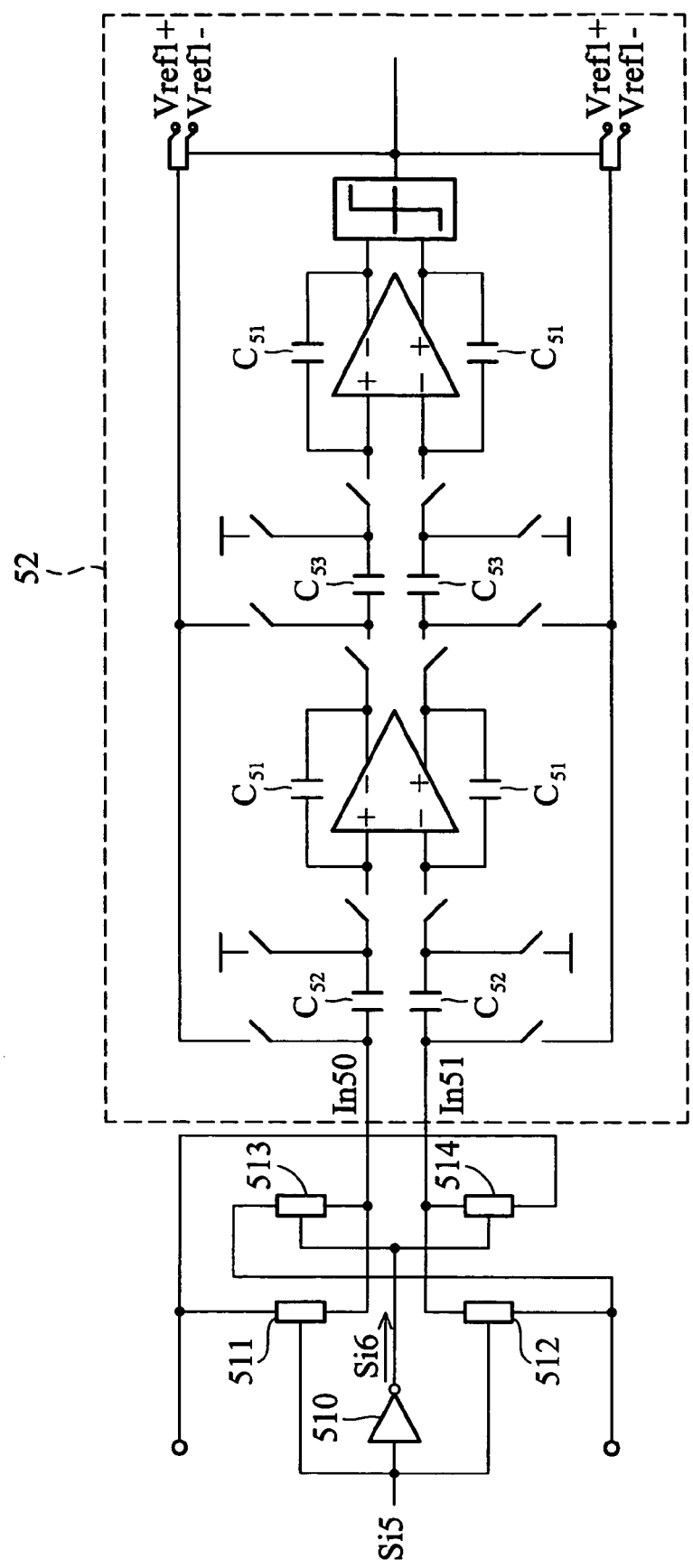
FIG. 5 shows a circuit of the IC with built-in self-test according to an embodiment of the invention.

FIG. 5 shows a circuit of the IC with built-in self-test according to an embodiment of the invention. The circuit structure of the SD-ADC 52 is similar as that of the SD-ADC 4 in FIG. 3b. In the SD-ADC 52, the ratio of a capacitor $C_{52}$ to a capacitor $C_{51}$ and the ratio of a capacitor $C_{53}$ to a capacitor $C_{51}$ correspond to a first-stage gain $a_{51}$ and a second-stage gain $a_{52}$ respectively. The Dft circuit 51 comprises an inverter 510 and switches 511 to 514. The inverter 510 receives the digital stimulus Si5 and outputs a signal Si6 inverse to the digital stimulus Si5. The switches 511 and 512 are controlled by the digital stimulus Si5 and the switches 513 and 514 are controlled by the signal Si6. Output terminals of the switches 511 and 513 are coupled to an input terminal In50 of the SD-ADC 52 and output terminals of the switches 512 and 514 are coupled to an input terminal In51 thereof. The switches 511 to 514 can be transistor switches.

In operating mode, the switches 511 and 514 receive an analog input signal Vin+ and the switches 512 and 513 receive an analog input signal Vin− inverse to the analog input signal Vin+. A voltage level of the digital stimulus Si5 is high and the inverter 510 outputs the signal Si6 at low voltage level. Because the switches 511 and 512 are turned on and the switches 513 and 514 are turned off, the analog input signals Vin+ and Vin− are input to the input terminals In50 and In51 respectively. The SD-ADC 52 outputs a digital output signal Vout50 according to the analog input signals Vin+ and Vin−.

In testing mode, the switches 511 and 514 receive the reference voltage signal Vref2+ and the switches 512 and 513 receive the reference voltage signal Vref2−. The digital stimulus Si5 is a digital signal generated from a digital converter simulated by software. That is, the voltage level of the digital stimulus Si5 is same as that of the digital output signal Vout50. When the voltage level of the digital stimulus Si5 is high, that of the signal Si6 low, so that, switches 511 and 512 are turned on and the switches 513 and 514 turned off. The reference voltage signals Vref2+ and Vref2− are input to the input terminals In50 and In51 respectively. Similarly, when the voltage level of the digital stimulus Si5 is low, that of the signal Si6 high, so that, the switches 511 and 512 are turned off and the switches 513 and 514 turned on. The reference voltage signals Vref2− and Vref2+ are input to the input terminals In50 and In51 respectively. As described above, each of the input terminals In50 and In51 receives the reference voltage signals Vref2+ and Vref2− alternately. The SD-ADC 52 then outputs the digital output signal Vout51 according to the reference voltage signals Vref2+ and Vref2−.

Figure 6:
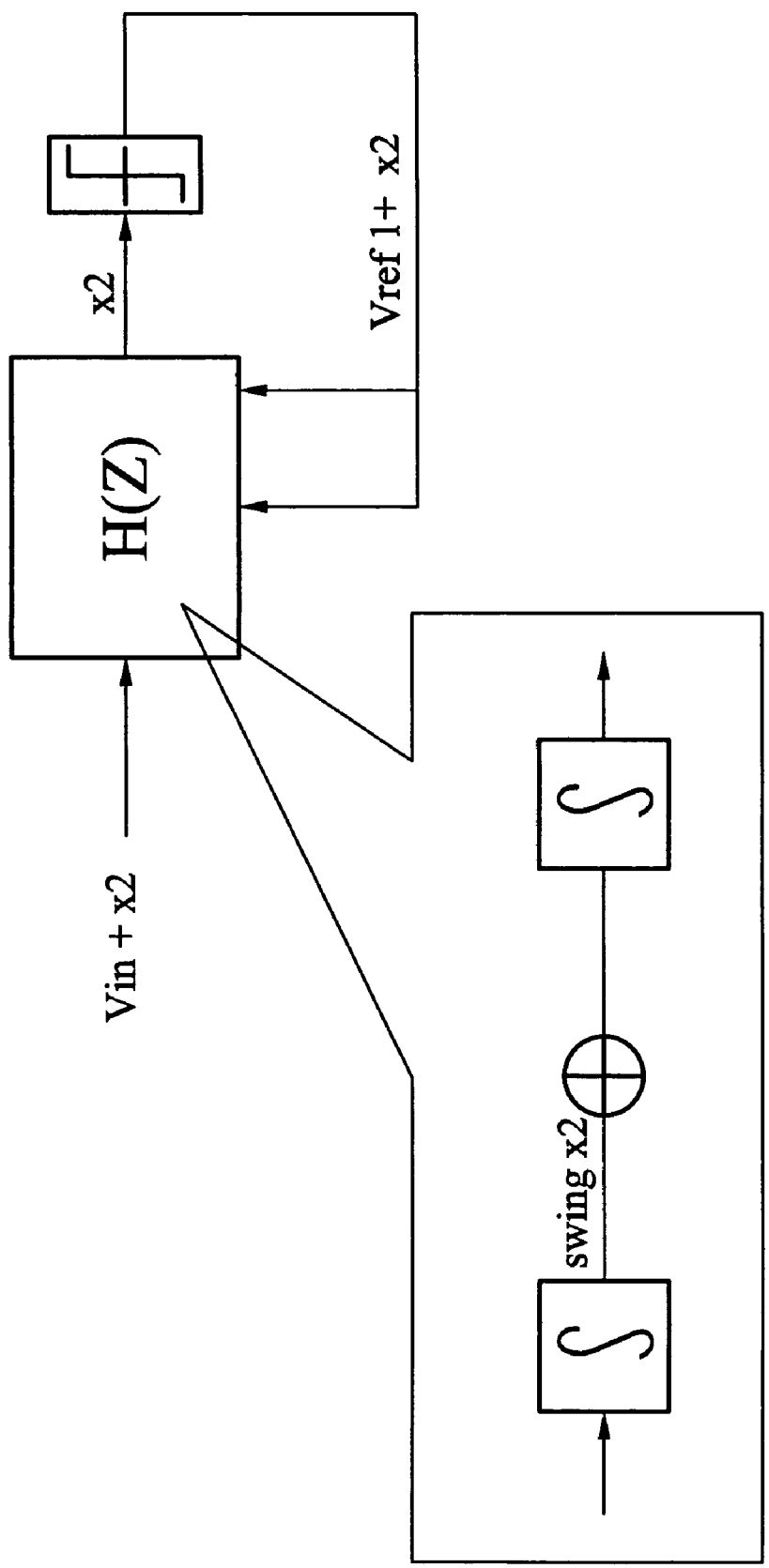
FIG. 6 is a diagram of simplifying the parameters of the IC with built-in self-test.

In an embodiment of the invention, there are many main parameters, such as, the first-stage gain $a_{51}$, the second-stage gain $a_{52}$, the reference voltage signals Vref1+ and Vref1−, the analog input signals Vin+ and Vin−, and the gain of the Dft circuit 51. The reference voltage signals Vref2+ and Vref2− are inverse to each other and so are the analog input signals Vin+ and Vin−. Through simulation, if the signals Vref1+ and Vin+ are multiplied by two at the same time, the SNR of the SD-ADC 52 is not changed as shown in FIG. 6. Output swings of the integrators, however, are increased by two. In other words, when the ratio of the reference voltage signal Vref1+ to the analog input signal Vin+ is fixed, SNR of the SD-ADC 52 is not changed. Thus, the number of variable parameters is reduced.

Figure 7:
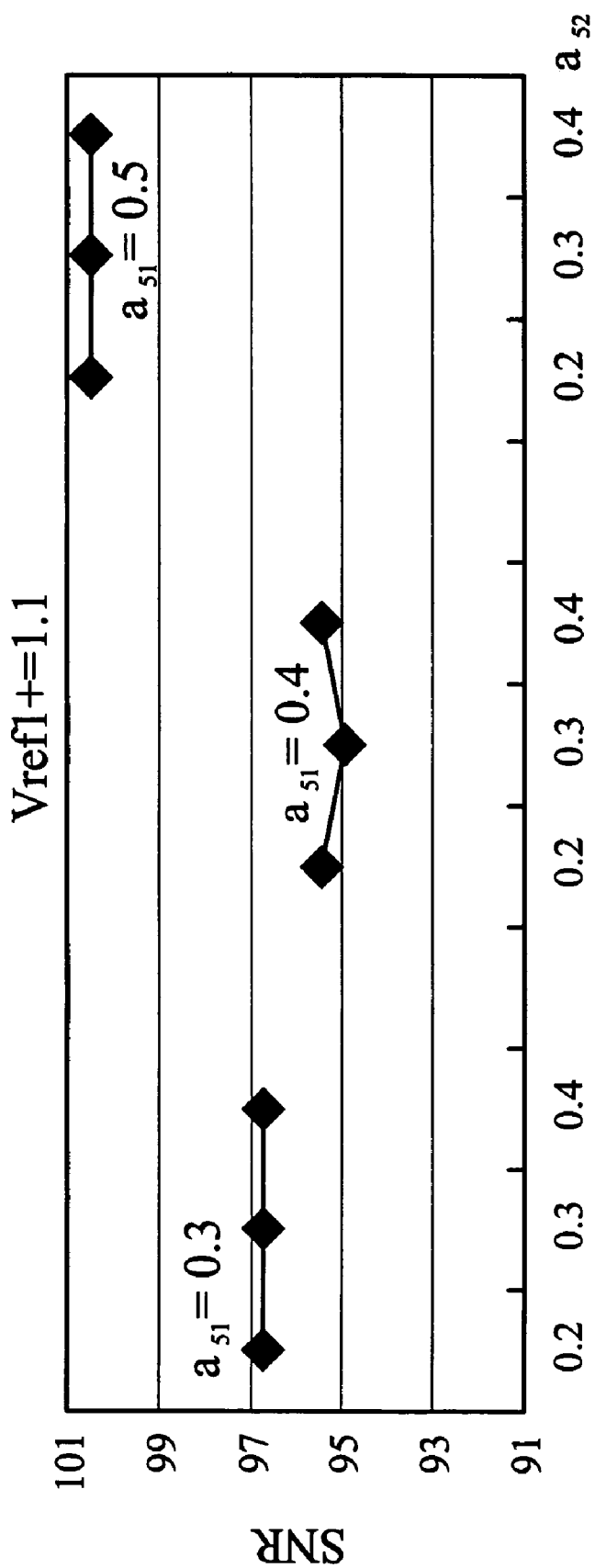
FIGS. 7 and 8 show the effect on SNR by applying the variant second-stage gain $a_{52}$.
Figure 8:
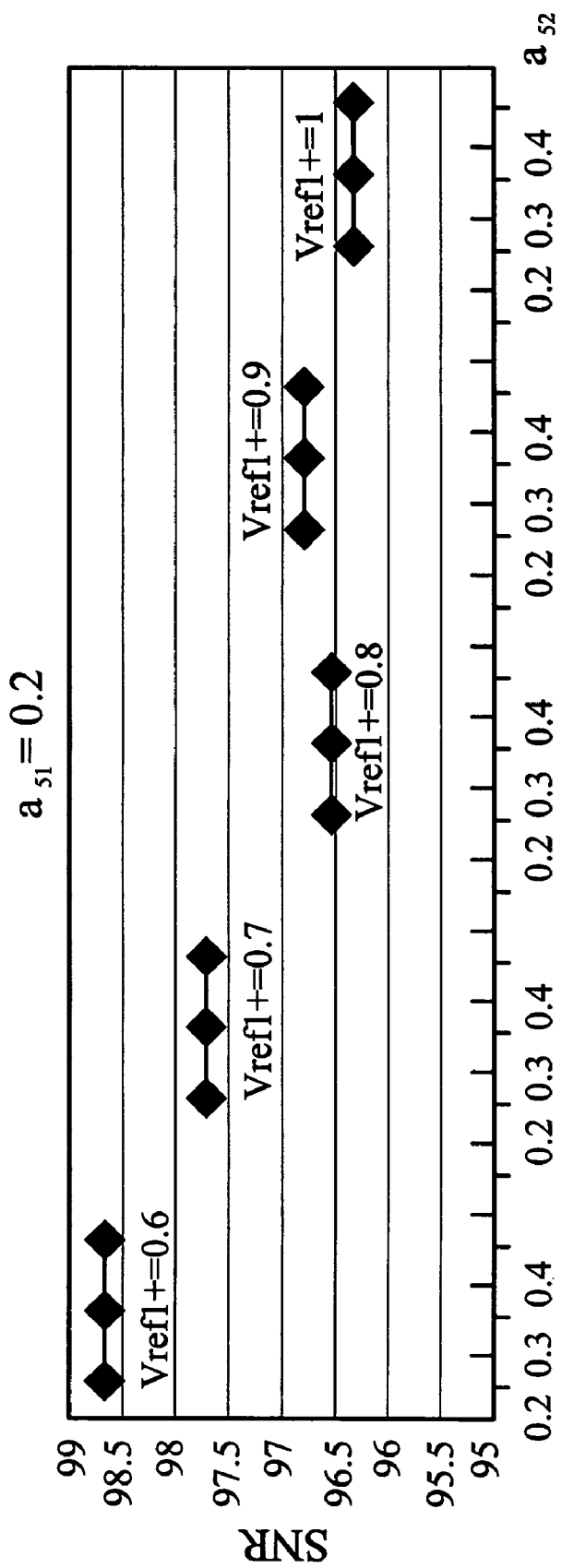

FIGS. 7 and 8 show the effect of applying the variant second-stage gain $a_{52}$ on SNR. It is assumed that the reference voltage signal Vref1+ is fixed and the gains $a_{51}$ and $a_{52}$ are variable. When the value of the first-stage gain $a_{51}$ is selected, the variant second-stage gain $a_{52}$ affects SNR slightly. Thus, the analysis of the variant second-stage gain $a_{52}$ is neglected and the dimension of the design parameters is reduced.

Figure 9:
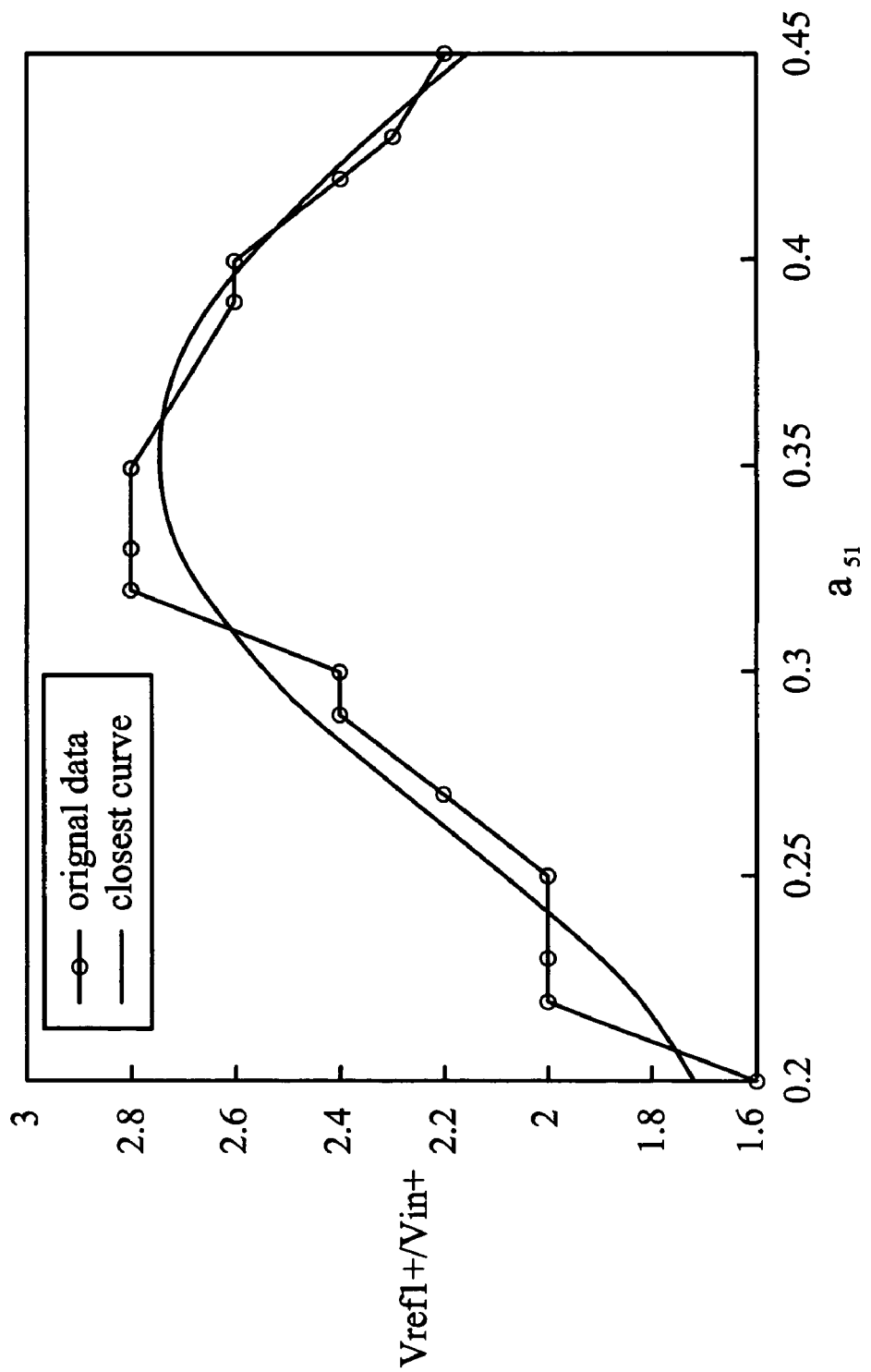
FIGS. 9 and 10 show simulation results of the ratio of the signal Vref1+ to the signal Vin+ at some values of the first-stage gain $a_{51}$.
Figure 10:
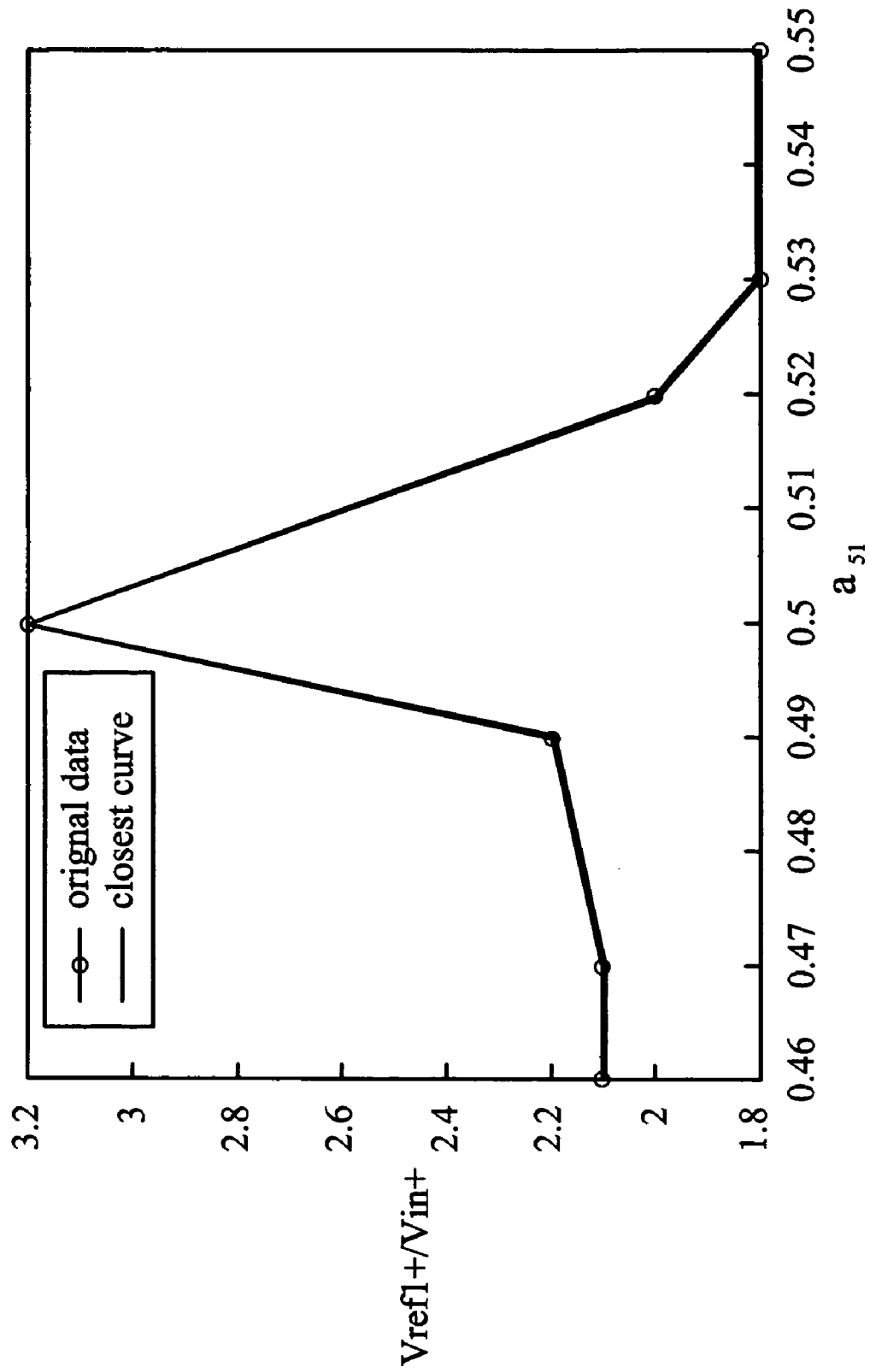

In order to insert the Dft circuit 51 feasibly and easily, an embodiment of the invention provides a method for choosing the parameters. Taking a 16-bit circuit as an example, a ratio of the reference voltage signal Vref1+ to the analog input signal Vin+ is defined as a new variable. After inserting the Dft circuit 51, in order to keep stability, it has to fine the range of the ratio of the signal Vref1+ to the signal Vin+ and the first-stage gain $a_{51}$. FIGS. 9 and 10 show simulation results of the ratio of the signal Vref1+ to the signal Vin+ and the first-stage gain $a_{51}$. When the gain of the Dft circuit 51 is 1 and the first-stage gain $a_{51}$ is between 0.2 and 0.45, the range of the ratio of the signal Vref1+ to the signal Vin+ is shown in FIG. 9. When the gain of the Dft circuit 51 is 1 and the first-stage gain $a_{51}$ is between 0.46 and 0.55, the range of the ratio of the signal Vref1+ to the signal Vin+ is shown in FIG. 10. The following formulas 2 and 3 are determined according to the closest curve and the errors between the formulas 2 and 3 and the real value are calculated with the formula 1.

$$\text{error} = \sqrt{\sum \frac{(f-\hat{f})^2}{f^2}} \quad \text{(formula 1)}$$

$$a_{51} = 0.2 \sim 0.45, \hat{f}_{\min}(\chi) \le \frac{vref1+}{vin+} \le \hat{f}_{\max}(\chi)$$

$$\hat{f}_{\min}(\chi) = 0.12$$

$$\hat{f}_{\max}(\chi) = 1.5214 \times 10^3 \chi^4 - 2.1347 \times 10^3 \chi^3 + 1.0454 \times 10^3 \chi^2 - 0.2078 \times 10^3 \chi + 0.0161$$

$$\text{error} = 0.019892 \quad \text{(formula 2)}$$

$$a_{51} = 0.46 \sim 0.55, \hat{f}_{\min}(\chi) \le \frac{vref1+}{vref+} \le \hat{f}_{\max}(\chi)$$

$$\hat{f}_{\min}(\chi) = 0.12$$

$$\hat{f}_{\max}(\chi) = -0.2735 \times 10^{10} \chi^6 + 0.8261 \times 10^{10} \chi^5 - 1.0388 \times 10^{10} \chi^4 + 0.6961 \times 10^{10} \chi^3 - 0.2622 \times 10^{10} \chi^2 + 0.0526 \times 10^{10} \chi - 0.0044$$

$$\text{error} = 1.7178e{-}007 \quad \text{(formula 3)}$$

wherein, $f$ represents real SNR, $\hat{f}_{min}$ a minimum simulate SNR, and $\hat{f}_{max}$ a maximum simulate SNR.

In a SC type SD-ADC, thermal noise seriously affects the performance thereof. The thermal noise can be determined by simulation with a Dft circuit. First, a Dft circuit 51 is applied in the SD-ADC 52 and the SD-ADC 52 is simulated based on the system of FIG. 4. The gain of the Dft circuit 51 is set to be 1, that is, the digital stimulus Si5 with no amplitude decreased is applied to the SD-ADC 52. Referring to the simulation result shown in Table 1, SNR of the SD-ADC 52 is 105.92 dB. The quantization noise referring to the digital stimulus Si5 is calculated by software simulation and equal to 1.04 dB. The real SNR of 106.96 dB determined by adding 105.92 dB and 1.04 dB, as high as that of the original SD-ADC.

Figure 1:
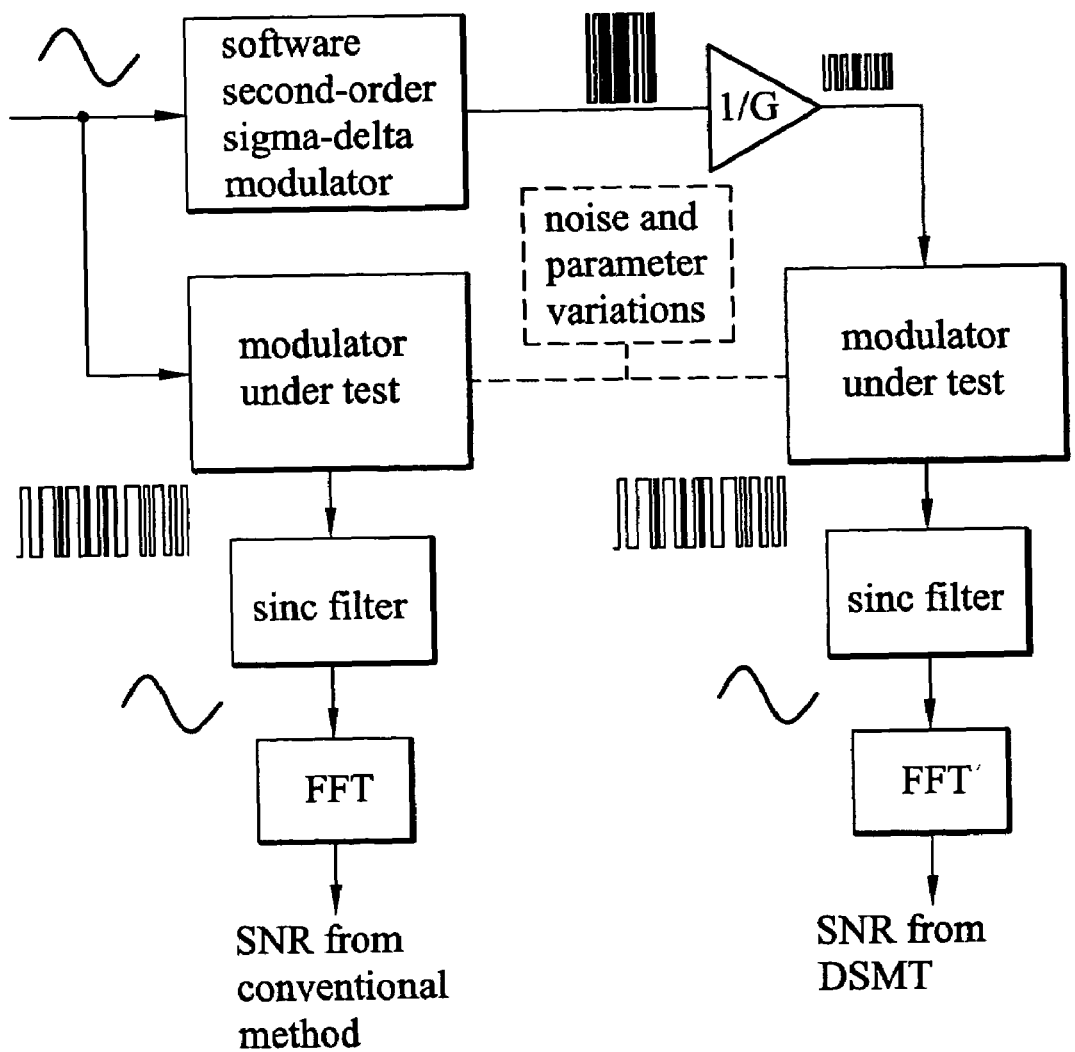
FIG. 1 is flow chart of a digital stimulus measurement technique of the related art.
Figure 2:
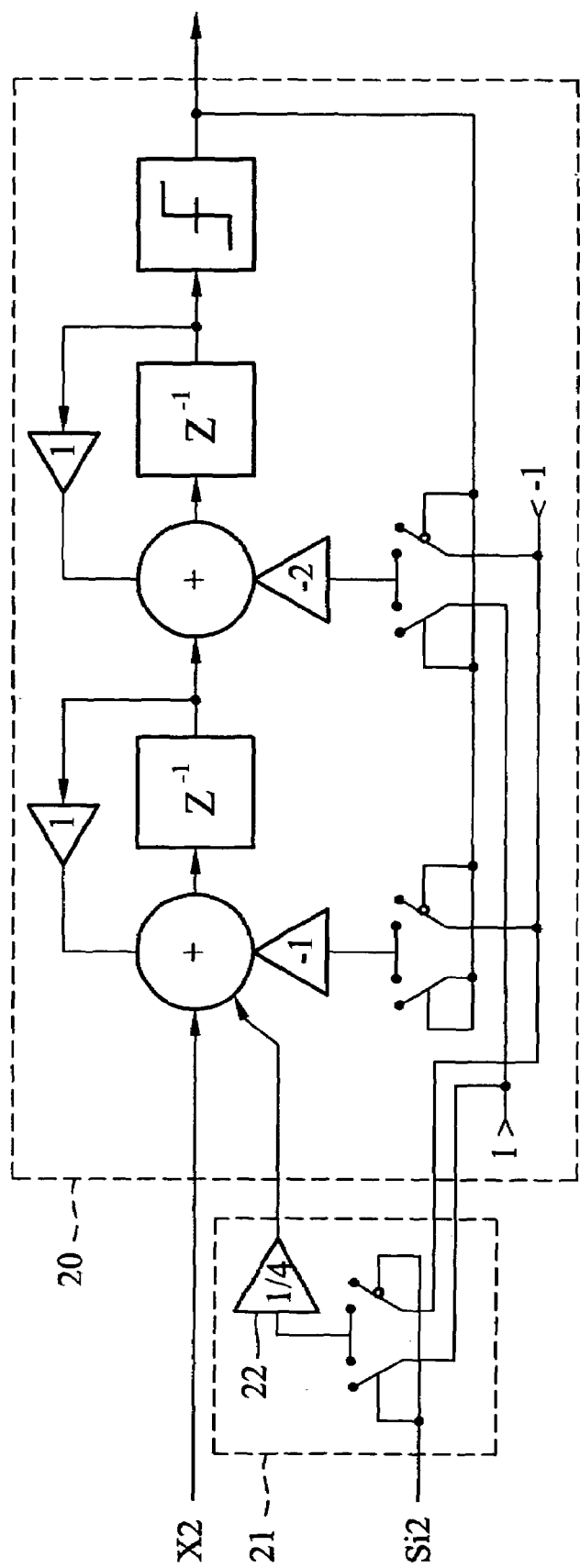
FIG. 2 is a system block diagram of the delta-sigma modulator with a test circuit in FIG. 1.

Referring to the related art, a Dft circuit 21 is applied in a SD-ADC 20 and the second-order SD-ADC 20 is simulated based on the system of FIG. 2. The gain of the Dft circuit 21 is set to be ¼. The simulation result is shown in Table 2. Comparing the real SNR of this embodiment and the related art, the real SNR of this embodiment is almost equal to that of the original SD-ADC. Therefore, the SD-ADC 52 can be implemented without performance degradation.

TABLE 1

|  | SNR (dB) | Power loss (dB) | quantization noise (dB) | Real SNR (dB) |
| --- | --- | --- | --- | --- |
| Original SD-ADC | 106.97 | 0 | 0 | 106.97 |
| SD-ADC 52 | 105.92 | 0 | 1.04 | 106.96 |

TABLE 2

|  | SNR (dB) | Power loss (dB) | quantization noise (dB) | Real SNR (dB) |
| --- | --- | --- | --- | --- |
| Original SD-ADC | 106.36 | 0 | 0 | 106.36 |
| SD-ADC 20 | 92.25 | 12 | 0 | 104.25 |

Figure 11:
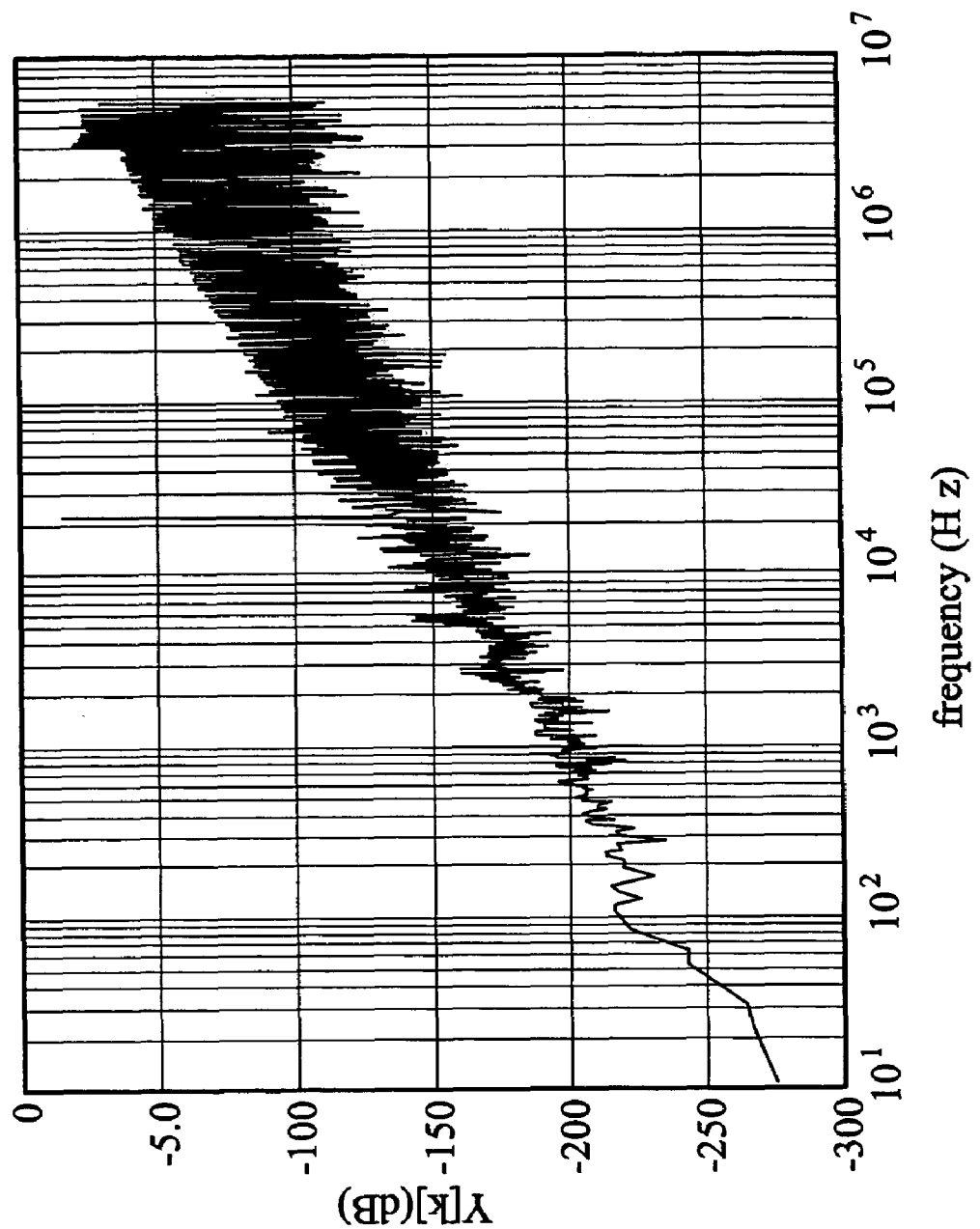
FIG. 11 is a spectrum diagram of the SD-ADC 52 tested by an analog stimulus.
Figure 12:
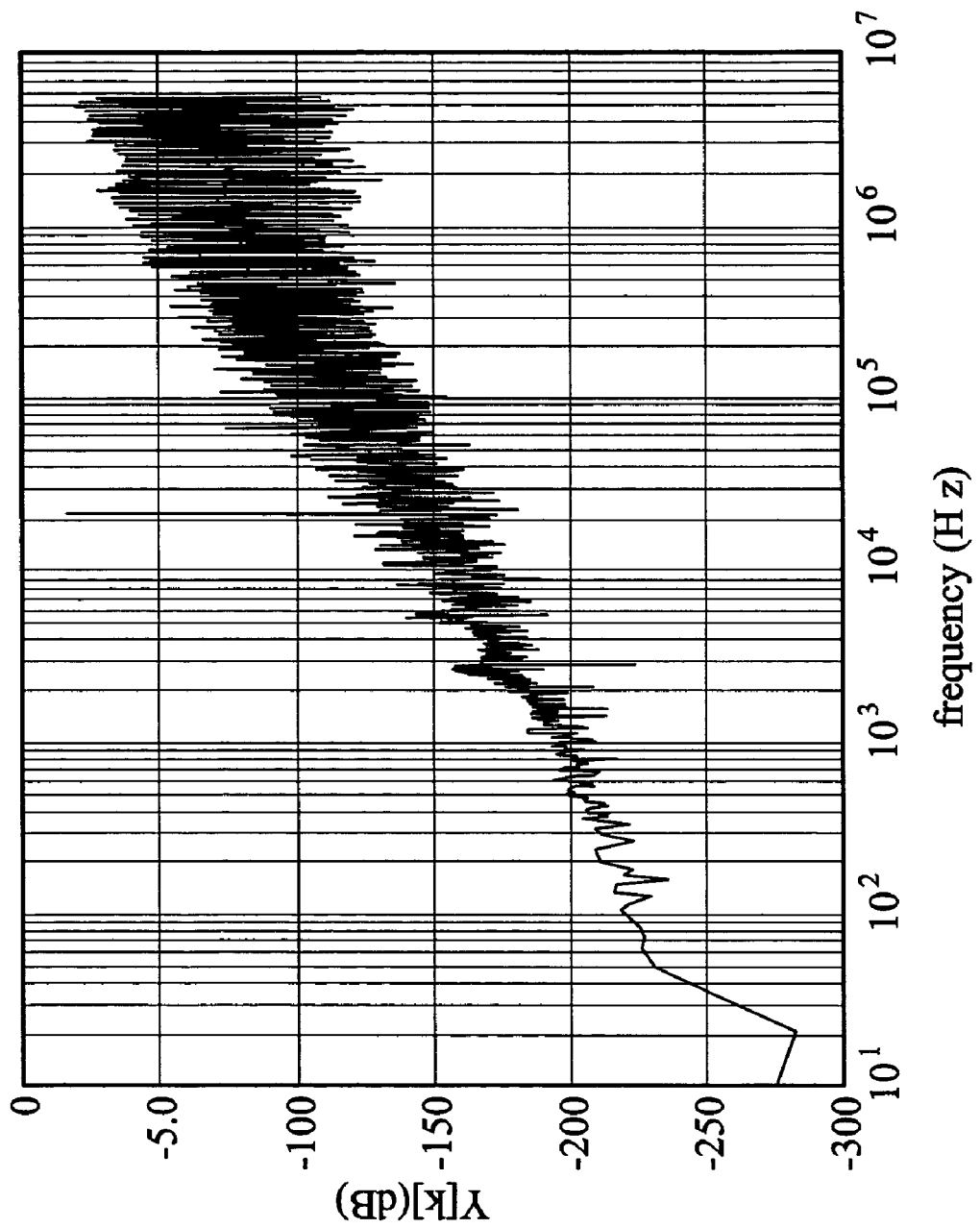
FIG. 12 is a spectrum diagram of the SD-ADC 52 tested by a digital stimulus.

FIG. 11 is a spectrum diagram of the SD-ADC 52 tested by an analog stimulus. FIG. 12 is a spectrum diagram of the SD-ADC 52 tested by a digital stimulus. Referring the spectrum diagrams in FIGS. 11 and 12, the built-in Dft circuit 51 can determine the performance of the IC according to this embodiment.

Figure 13:
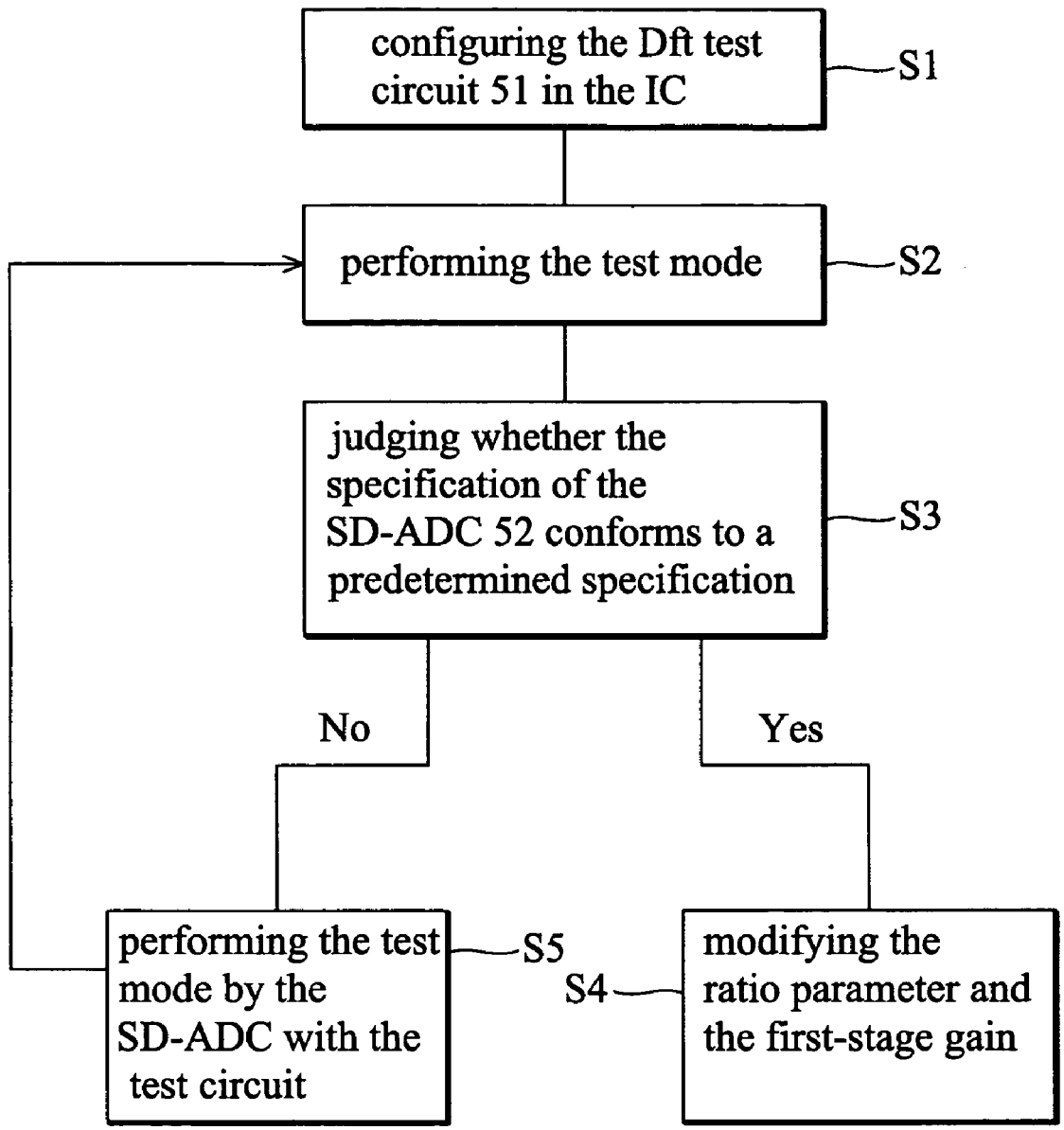
FIG. 13 is a flow chart of a design method for an IC with built-in self-test according to an embodiment of the invention.

FIG. 13 is a flow chart of a design method for an IC with built-in self-test according to an embodiment of the invention. Referring to FIGS. 4 and 13, a Dft circuit 51 is applied to the IC (step S1). A testing mode is performed for a SD-ADC 52 (step S2). It is judged whether the specification of the SD-ADC 52 conforms to a predetermined specification according to the test result (step S3). When the specification of the SD-ADC 52 conforms to the predetermined specification, the Dft circuit 51 performs the testing mode (step S4). When the specification of the SD-ADC 52 does not conform to the predetermined specification, the ratio of the reference voltage signal Vref1+ t0 to the analog input signal Vin+ is set to be a ratio parameter and the ratio parameter and the first stage gain $a_{51}$ are modified (step S5). Noted that the predetermined specification serves for all requirements during the design flow.

As the described above, the IC of the embodiment of the invention comprises a build-in Dft circuit and performs self-testing by a digital stimulus. Moreover, according to the design method of the embodiment of this invention, the design difficulty of the IC is reduced and the performance degradation caused by the thermal noise is prevented. The built-in Dft circuit is further applied in many IC with various specification.

Finally, while embodiments of the invention have been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An IC with built-in self-test, comprising:
   a sigma-delta analog-to-digital converter (SD-ADC) having a first and a second input terminals, receiving a first and a second reference voltage signals, and comprising a first-stage translation unit with a first-stage gain and a second-stage translation unit with a second-stage gain; and
   a test circuit testing the SD-ADC and receiving a first stimulus, wherein a gain of the test circuit is set to 1;
   wherein in a testing mode, the test circuit respectively provides a third reference voltage signal and a fourth reference voltage signal inverse to the third reference voltage signal to the first and the second input terminals according to the first stimulus and the SD-ADC outputs a first digital signal;
   wherein in an operating mode, the test circuit respectively provides a first and a second analog signals to the first and the second input terminals according to the first stimulus and the SD-ADC outputs a second digital signal.

2. The IC with built-in self-test as claimed in claim 1, wherein parameters of the SD-ADC are adjusted according to a method comprising:
   performing the test mode;
   judging whether the specification of the SD-ADC conforms a predetermined specification;
   performing the test mode by the SD-ADC with the test circuit when the specification of the SD-ADC conforms the predetermined specification; and
   setting the ratio of the first reference voltage signal to the first analog signal to be a ratio parameter and modifying the ratio parameter and the first-stage gain when the specification of the SD-ADC does not conform to the predetermined specification.

3. The IC with built-in self-test as claimed in claim 1, wherein the test circuit comprises:
   a inverter receiving the first stimulus and outputting a second stimulus inverse to the first stimulus;
   a first and a second switches controlled by the first stimulus, wherein output terminals of the first and the second switches are coupled to the first and the second input terminals respectively; and
   a third and a fourth switches controlled by the second stimulus, wherein output terminals of the third and the fourth switches are coupled to the first and the second input terminals respectively;
   wherein in the testing mode, the first and the fourth switches receive the third reference voltage signal and the second and the third switches receive the fourth reference voltage signal;
   wherein in the operating mode, the first and the fourth switches receive the first analog signal and the second and the third switches receive the fourth reference and the second analog signal.

4. The IC with built-in self-test as claimed in claim 3, wherein in the testing mode, when the first and the second switches are turned on according to the first stimulus and respectively provide the third and the fourth reference voltage signals to the first and the second input terminals, the third and the fourth switches are turned off according to the second stimulus; and
   wherein in the testing mode, when the first and the second switches are turned on according the first stimulus, the third and the fourth switches are turned on according to the second stimulus and respectively provide the fourth and the third reference voltage signals to the first and the second input terminals.

5. The IC with built-in self-test as claimed in claim 4, wherein in the testing mode, the first stimulus is a bit stream.

6. The IC with built-in self-test as claimed in claim 3, wherein in the operating mode, the first and the second switches are turned on according the first stimulus and respectively provide the first and the second analog signals to the first and the second input terminals.

7. The IC with built-in self-test as claimed in claim 6, wherein in the operating mode, the first stimulus is a digital signal at a high level.

8. The IC with built-in self-test as claimed in claim 3, wherein the switches are transistor switches.

9. A design method for an IC with built-in self-test applied in a sigma-delta analog-to-digital converter (SD-ADC), the SD-ADC receives a first and a second analog signals in an operating mode and has a predetermined specification and a plurality of parameters comprising a first and a second reference voltage signals, and a first-stage and a second-stage gains, the design method comprising:
   configuring a test circuit in the SD-ADC, wherein the test circuit tests the SD-ADC and receives a first stimulus and a gain of the test circuit is set to 1;
   performing a test mode;
   judging whether the specification of the SD-ADC conforms a predetermined specification;
   performing the test mode by the SD-ADC with the test circuit when the specification of the SD-ADC conforms the predetermined specification; and
   setting the ratio of the first reference voltage signal to the first analog signal to be a ratio parameter and modifying the ratio parameter and the first-stage gain when the specification of the SD-ADC does not conform to the predetermined specification.

10. The design method as claimed in claim 9, wherein in the testing mode, the test circuit receives a first stimulus and respectively provides a third reference voltage signal and a fourth reference voltage signal inverse to the third reference voltage signal to a first and a second input terminal according to the first stimulus, and the SD-ADC outputs a first digital signal; and
    wherein when in the operating mode, the test circuit respectively provides the first and the second analog signals to the first and the second input terminals according to the first stimulus and the SD-ADC outputs a second digital signal.

11. The design method as claimed in claim 10, wherein the first stimulus is a digital signal.

12. The design method as claimed in claim 10, wherein the test circuit comprises:
    a inverter receiving the first stimulus and outputting a second stimulus inverse to the first stimulus;
    a first and a second switches controlled by the first stimulus, wherein output terminals of the first and the second switches are coupled to the first and the second input terminals respectively; and
    a third and a fourth switches controlled by the second stimulus, wherein output terminals of the third and the fourth switches are coupled to the first and the second input terminals respectively;
    wherein in the testing mode, the first and the fourth switches receive the third reference voltage signal and the second and the third switches receive the fourth reference voltage signal;
    wherein in the operating mode, the first and the fourth switches receive the first analog signal and the second and the third switches receive the fourth reference the second analog signal.

13. The design method as claimed in claim 12, wherein in the testing mode, when the first and the second switches are turned on according to the first stimulus and respectively provide the third and the fourth reference voltage signals to the first and the second input terminals, the third and the fourth switches are turned off according to the second stimulus; and wherein in the testing mode, when the first and the second switches are turned on according to the first stimulus, the third and the fourth switches are turned on according to the second stimulus and respectively provide the fourth and the third reference voltage signals to the first and the second input terminals.

14. The design method as claimed in claim 13, wherein in the testing mode, the first stimulus is a bit stream.

15. The design method as claimed in claim 12, wherein in the operating mode, the first and the second switches are turned on according the first stimulus and respectively provide the first and the second analog signals to the first and the second input terminals.

16. The design method as claimed in claim 15, wherein in the operating mode, the first stimulus is a digital signal at a high level.

17. The design method as claimed in claim 12, wherein the switches are transistor switches.

* * * * *